United States Patent
Yanai

(10) Patent No.: US 11,486,895 B2
(45) Date of Patent: Nov. 1, 2022

(54) CHUCK UNIT AND METHOD FOR CONTROLLING TEMPERATURE OF THE CHUCK UNIT

(71) Applicant: HiSOL, Inc., Tokyo (JP)

(72) Inventor: Hirofumi Yanai, Tokyo (JP)

(73) Assignee: HiSOL, Inc., Tokyo (JP)

( * ) Notice: Subject to any disclaimer, the term of this patent is extended or adjusted under 35 U.S.C. 154(b) by 0 days.

(21) Appl. No.: 17/480,911

(22) Filed: Sep. 21, 2021

(65) Prior Publication Data
US 2022/0146550 A1 May 12, 2022

(30) Foreign Application Priority Data
Nov. 12, 2020 (JP) ............................. JP2020-188367

(51) Int. Cl.
*F25B 21/02* (2006.01)
*G01R 1/04* (2006.01)

(52) U.S. Cl.
CPC ............ *G01R 1/0458* (2013.01); *F25B 21/02* (2013.01); *F25B 2321/023* (2013.01)

(58) Field of Classification Search
CPC ........... F25B 2321/023; F25B 2321/02; G01R 1/0458
See application file for complete search history.

(56) References Cited

U.S. PATENT DOCUMENTS

| | | | | |
|---|---|---|---|---|
| 8,508,245 B1 * | 8/2013 | Barabi | ................ | G01R 1/0458 324/750.03 |
| 9,538,583 B2 * | 1/2017 | Volfovski | ............ | H05B 1/0233 |
| 10,314,203 B1 * | 6/2019 | Yatskov | ............. | H05K 7/20381 |
| 10,468,276 B2 * | 11/2019 | Benjaminson | .......... | H01L 22/12 |
| 10,747,126 B2 * | 8/2020 | Kunnen | ............... | G03F 7/70875 |
| 2002/0109518 A1 * | 8/2002 | Saito | ................... | G01R 31/2868 324/750.09 |
| 2006/0033892 A1 * | 2/2006 | Cadee | ................ | G03F 7/70341 355/30 |
| 2012/0196242 A1 * | 8/2012 | Volfovski | ............ | H01L 21/6875 432/92 |
| 2013/0087309 A1 | 4/2013 | Volfovski et al. | | |

(Continued)

FOREIGN PATENT DOCUMENTS

| | | |
|---|---|---|
| JP | H07115058 A | 5/1995 |
| JP | 2001274078 A | 10/2001 |

(Continued)

OTHER PUBLICATIONS

Decision to Grant a Patent issued in Japanese Patent Application No. 2020-188367.

*Primary Examiner* — Filip Zec

(74) *Attorney, Agent, or Firm* — Marshall, Gerstein & Borun LLP

(57) ABSTRACT

A chuck unit includes a chuck on which a semiconductor is mounted, a heating part including a heater and configured to heat the chuck, a cooling block configured to cool the heating part by using fluid-cooling, and a Peltier module configured to cool the cooling block. The heater is configured to be energized while the cooling block and the Peltier module are spaced apart from each other, and the heater is configured to be cut off from energization while the cooling block and the Peltier module contact each other.

2 Claims, 5 Drawing Sheets

(56) References Cited

U.S. PATENT DOCUMENTS

| | | | | |
|---|---|---|---|---|
| 2013/0093270 A1* | 4/2013 | Kokas | ................... | H05K 7/205 |
| | | | | 310/52 |
| 2014/0356985 A1 | 12/2014 | Ricci et al. | | |
| 2015/0109009 A1* | 4/2015 | Barabi | ................. | F16K 17/003 |
| | | | | 324/750.03 |
| 2018/0031285 A1* | 2/2018 | Thomas | .................. | F25B 21/04 |
| 2020/0086338 A1* | 3/2020 | Hogan | ...................... | B05B 1/24 |

FOREIGN PATENT DOCUMENTS

| JP | 2002231623 A | 8/2002 |
|---|---|---|
| JP | 2013123053 A | 6/2013 |
| JP | 2015008287 A | 1/2015 |
| JP | 201898237 A | 6/2018 |
| JP | 2019110251 A | 7/2019 |
| JP | 202021922 A | 2/2020 |

* cited by examiner

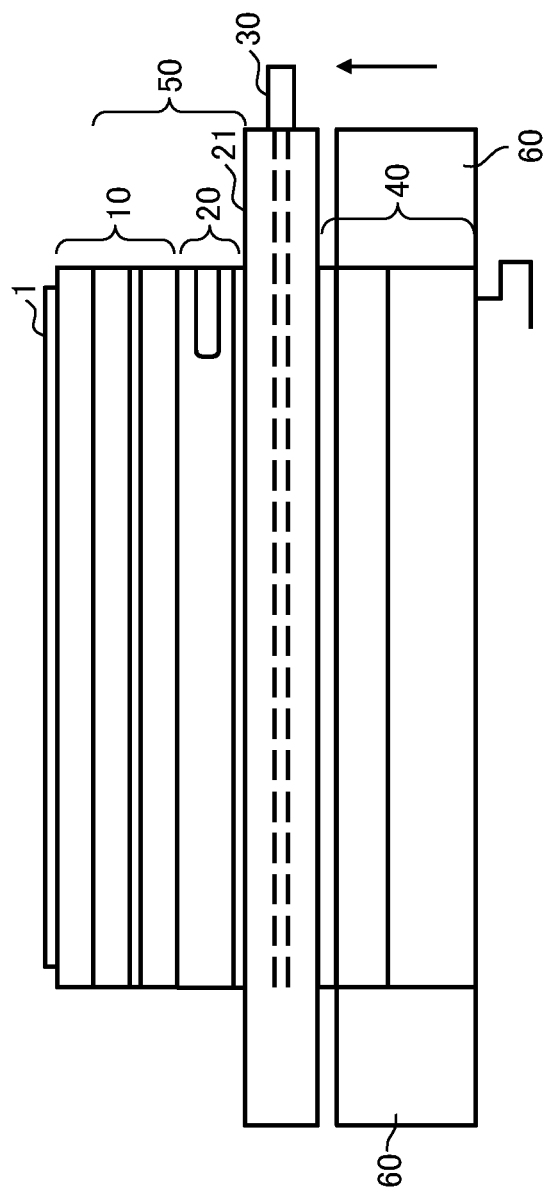
FIG.5
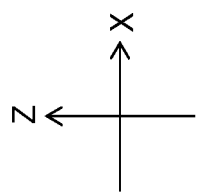

CHUCK UNIT AND METHOD FOR CONTROLLING TEMPERATURE OF THE CHUCK UNIT

CROSS-REFERENCE TO RELATED APPLICATIONS

This application is based upon and claims the benefit of priority from Japanese Patent Application No. JP2020-188367 filed on Nov. 12, 2020, the entire contents of which are incorporated herein by reference.

BACKGROUND ART

The present disclosure relates to a chuck unit on which a semiconductor is mounted and a method of energizing a heater, for example, relates to a chuck unit capable of setting in a range from a low temperature below a freezing point to a high temperature.

Most measurements of electric characteristics of a semiconductor device are conducted with a temperature characteristics test while a temperature is varied. In particular, a device for vehicle is used from a temperature below the freezing point under an environment to a high temperature in a vehicle. Therefore, an electrical test is also required to conduct in a range from a low temperature below the freezing point to a high temperature above a room temperature. The semiconductor device is mounted and fixed by using a chuck. To make the chuck at a high temperature, the chuck is required to be heated by a heater.

Japanese Patent Application Publication No. 2013-123053 (FIG. 3. Paragraph [0041]) discloses a heating and cooling device including a heater and a movable cooling module. The movable cooling module is a metal block which moves apart from the heater during heating and contacts the heater during cooling.

Since the heating and cooling device according to the above Japanese Patent Application Publication cools using the metal block made of aluminum or copper, a temperature of a wafer is not able to be below a room temperature. Therefore, it is considered that the movable cooling module is replaced with a Peltier module to cool the wafer below a room temperature. The Peltier module, however, has the following disadvantage. When the Peltier module contacts the heater and has a high temperature, its deterioration is accelerated.

SUMMARY OF THE INVENTION

The present disclosure comes from the above issue and provides a chuck unit and a method for controlling a temperature of the chuck unit which is capable of being set in a range from a temperature below the freezing point to a high temperature and reducing deterioration of a Peltier module.

To provide the above device and method, the chuck unit of the present disclosure includes a chuck on which a semiconductor is mounted, a heating part including a heater and configured to heat the chuck, a cooling block configured to cool the heating part by using fluid-cooling, and a Peltier module configured to cool the cooling block. The heater is configured to be energized while the cooling block and the Peltier module are spaced apart from each other. The heater is configured to be cut off from energization while the cooling block and the Peltier module contact each other. Note that, reference numerals and characters are described for embodiments and not limited to the present disclosure.

The present disclosure provides the chuck unit which is capable of being set in a range from a temperature below the freezing point (e.g., zero degree Celsius) to a high temperature and meanwhile reducing deterioration of the Peltier module.

BRIEF DESCRIPTION OF THE DRAWINGS

FIG. 5 is a view illustrating a chuck unit in which the chuck is being cooled with a Peltier module.

DESCRIPTION OF EMBODIMENTS

Figure 1:
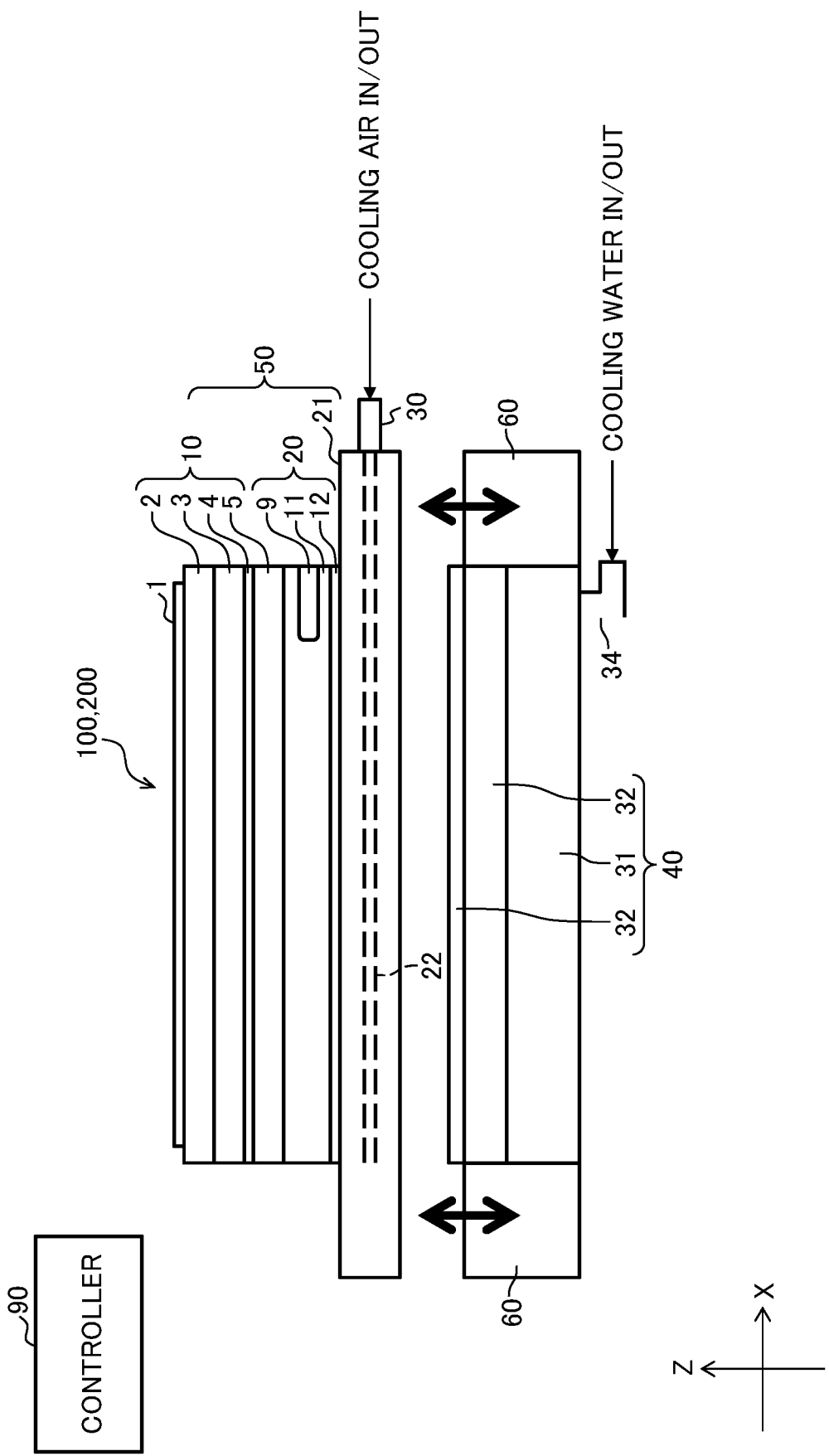
FIG. 1 is a construction view illustrating a chuck unit according to a first embodiment of the present disclosure.

Hereinafter, an embodiment of the present disclosure (hereinafter, referred to as the embodiment) will be described in detail with reference to the accompanying drawings. Note that each drawing just schematically illustrates embodiments to fully understand the embodiments. Further, in each drawing, the same reference numerals will be used for a common component or a similar component, and its duplicate description will be omitted.

FIG. 1 is a construction view illustrating a chuck unit 100 according to a first embodiment of the present disclosure. The chuck unit 100 is used for a measurement of electrical characteristics (voltage-current characteristics) of a wafer 1 while a temperature rises from a low temperature (e.g., −60 degrees Celsius) below the freezing point of water (e.g., zero degree Celsius) to a high temperature (a temperature more than a maximum specification temperature of a Peltier module, e.g., 300 to 400 degrees Celsius). The chuck unit 100 includes a chuck 10, a heating part 20, an air-cooling part 30 as a cooling part, a Peltier unit 40, a Z axis actuator 60 and a controller 90. Further, a prober 200 includes the chuck unit 100 and an XYZ stage (not shown) which is allowed to move the chuck unit 100.

The chuck 100 is a stack of a chuck top 2, a first insulator 3, a guard 4 and a second insulator 5. The chuck top 2 is a circular metal plate (e.g., Oxygen-Free Copper or OFC) on which a wafer 1 or a semiconductor such as an IC chip is mounted. The chuck top 2 has a front surface which defines a suction groove (not shown) to suck a semiconductor and a through hole (not shown) to suck out air. The first and second insulators 3, 5 are insulated ceramic plates formed so as to interpose the guard 4 therebetween. The guard 4 is a SUS thin plate to stabilize an electrical potential of the wafer 1 by keeping the guard 4, for example, at a ground potential.

The heating part 20 is formed by stacking a heating block 11 and a planar heater 12 on each other. The heating block 11 is a circular metal plate (e.g., OFC). The heating block 11 has a lower surface contacting the planar heater 12. That is, the heating block 11 is heated at a high temperature with the planar heater 12. The heating block 11 has a temperature sensor 9 embedded therein. The temperature sensor 9 obtains a temperature data, which is sent to the controller 90. The controller 90 controls a temperature of the planar heater 12 based on the temperature data. The heating block 11 has an upper surface contacting the second insulator 5 and heats the chuck 10.

The air-cooling part 30 includes an air-cooling block 21 made of a metal (a metal block). The air-cooling part 30 has an interior defining an air-flow hole 22 through which air for cooling flows. The air-flow hole 22 is formed in a spiral shape (not shown) in a plan view. The air-flow hole 22 has both ends having air-cooling ports (not shown) respectively in which resin pipes (not shown) are inserted respectively.

The Peltier unit 40 includes a Peltier module 31 and a water-cooling block 32. The Peltier module 31 is a thermo-electric element capable of heating and cooling from a temperature (e.g., −60 degrees Celsius) below the freezing point (e.g., zero degree Celsius) to a maximum specification temperature (e.g., 80 to 100 degrees Celsius). In other words, the Peltier module 31 is prone to deteriorate faster over its maximum specification temperature. The water-cooling block 32 is disposed on the rear surface of the Peltier module 31 and serves to cool the Peltier module 31. The water-cooling block 32 is provided with a water-cooling port 34 in which a resin pipe (not shown) is inserted.

The Z axis actuator 60 is allowed to move the Peltier unit 40 in a Z direction. That is, The Z axis actuator brings an upper surface of the Peltier module 31 in contact with a lower surface of the air-cooling block 21 or separates the upper surface of the Peltier module 31 from the lower surface of the air-cooling block 21. The chuck 10, the heating part 20 and the air-cooling part 30 are integrated together and this configuration is referred to as a fixed unit 50.

The controller 90 is a Personal Computer or PC including a control part (not shown; e.g., processor). The control part executes a control program stored in a memory, which achieves a control function to control, for example, the Peltier module 31, the Z axis actuator 60, an air-cooling pump (not shown), a water-cooling pump (not shown) and a measurement equipment (not shown).

Figure 2:
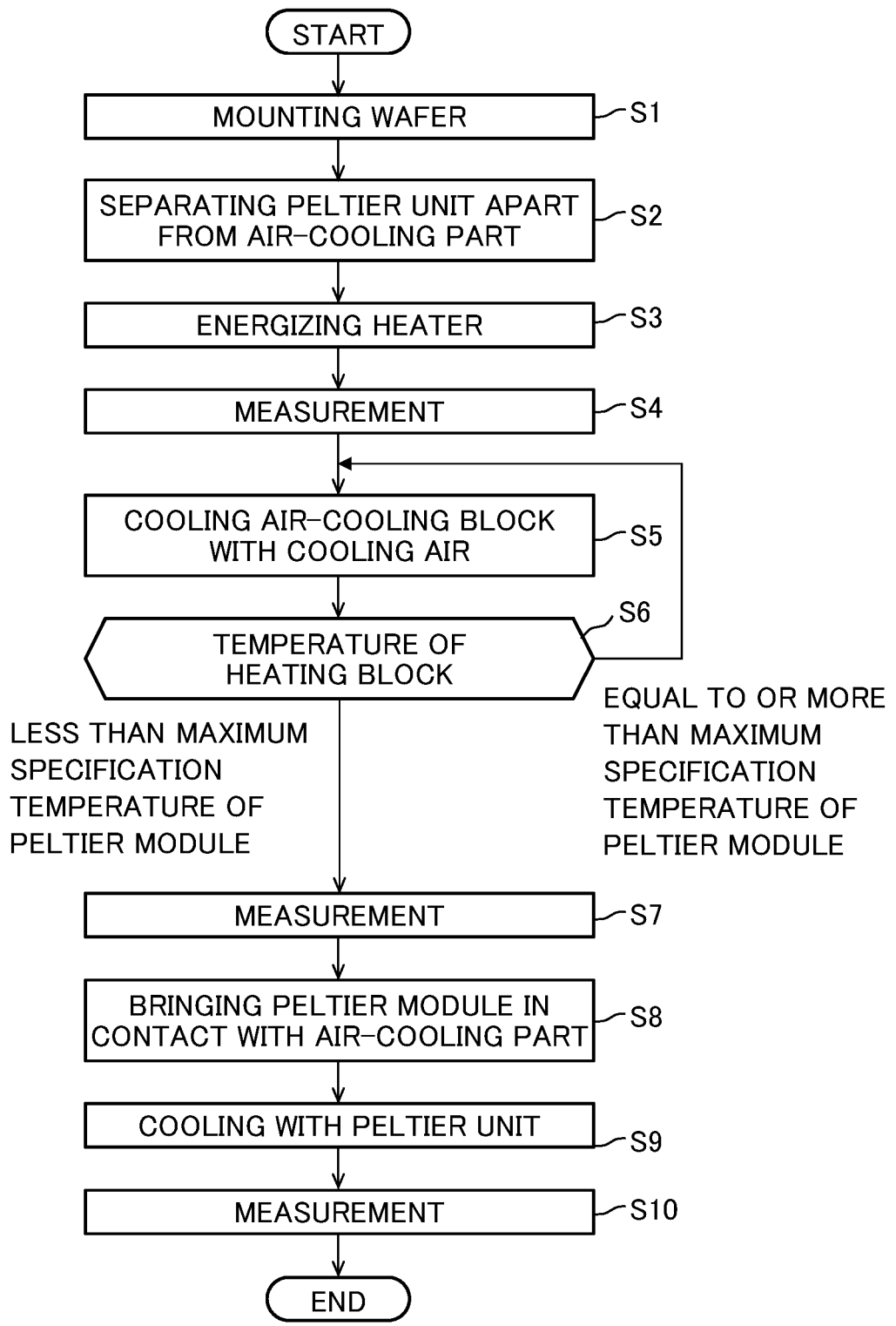
FIG. 2 is a flowchart illustrating a temperature characteristics test by using the chuck unit according to the first embodiment of the present disclosure.
Figure 3:
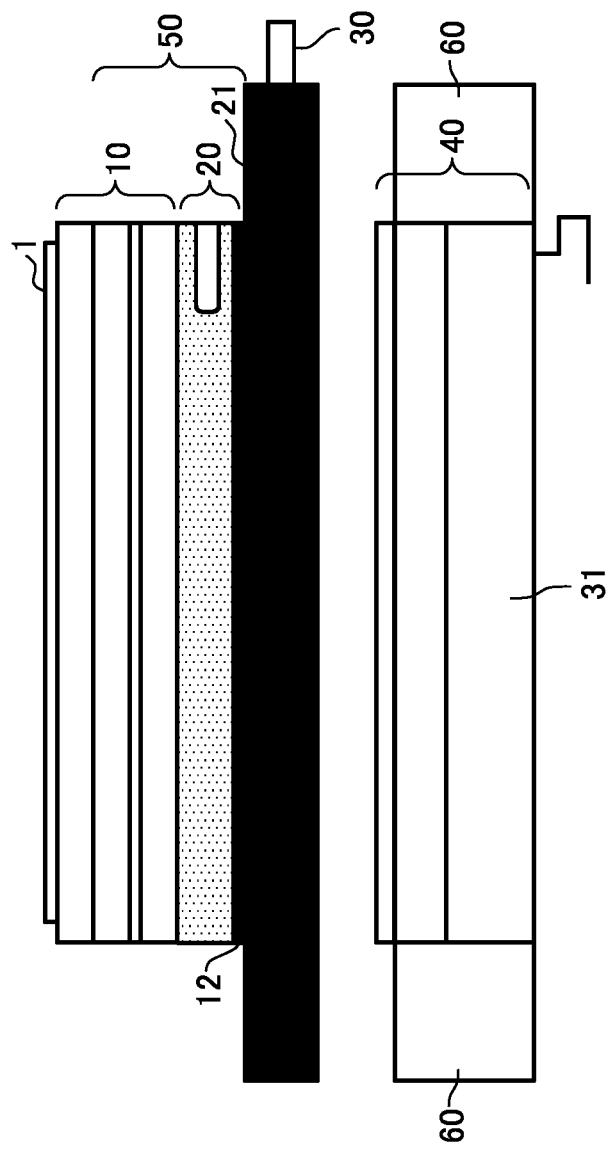
FIG. 3 is a view illustrating a chuck unit in which a chuck is being heated with a heater.
Figure 4:
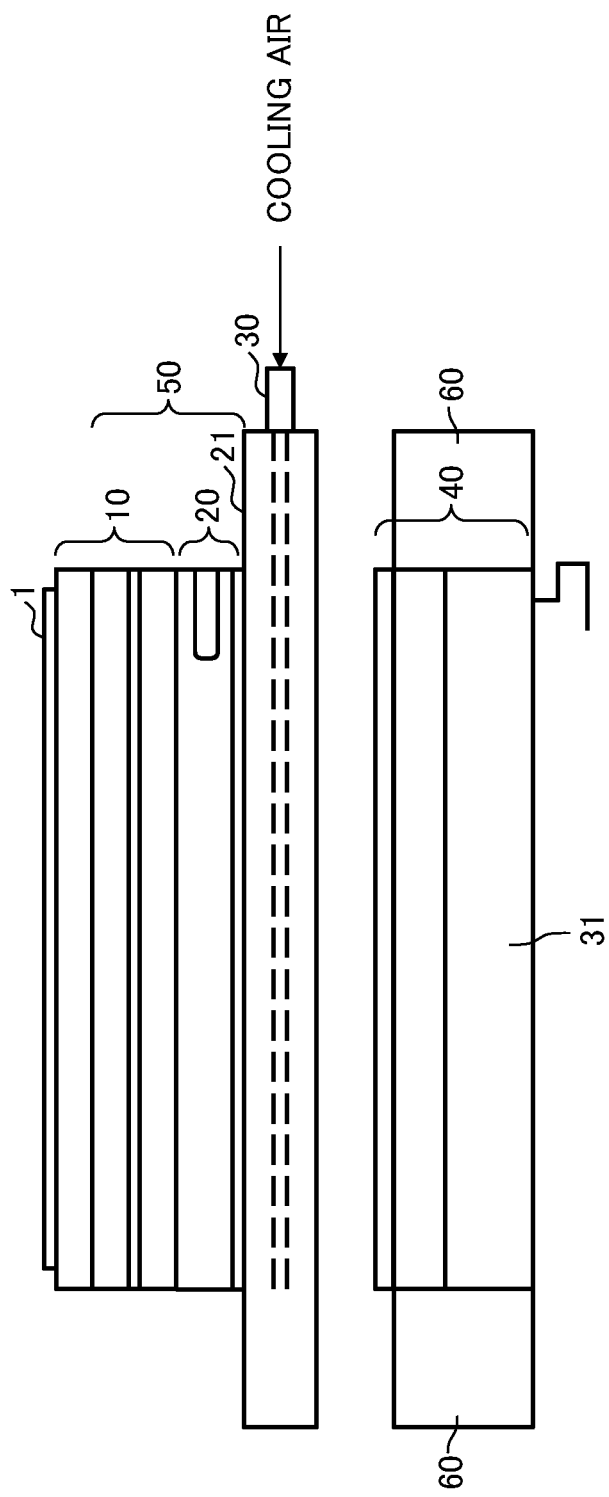
FIG. 4 is a view illustrating a chuck unit in which the chuck is being cooled to a prescribed temperature.

FIG. 2 is a flowchart illustrating a temperature characteristics test which includes a method of a temperature control (a method of energizing a heater) of the chuck unit 100 according to the first embodiment of the present disclosure. FIGS. 3 through 5 are views illustrating operations for the Peltier unit 40 and the air-cooling part 30 as a cooling part respectively.

First, an operator puts the wafer 1 on the chuck 10 (step S1). Next, the controller 90 controls the Z axis actuator 60 to separate the Peltier unit 40 apart from the air-cooling part 30 as shown in FIG. 3 (step S2). While the Peltier unit 40 and the air-cooling part 30 are spaced apart from each other, the controller 90 executes a process of energizing the planar heater 12 of the heating block 11 (step S3), thereby rendering the air-cooling block 21 in a prescribed high temperature condition. The high temperature condition here means a temperature (e.g., 300 to 400 degrees Celsius) higher than the maximum specification temperature (e.g., 80 to 100 degrees Celsius) of the Peltier module 31. In FIG. 3, a dotted area of the heating part 20 and the air-cooling part 30 represents a portion in a high temperature condition. When the temperature of the wafer 1 reaches a prescribed high temperature, the controller 90 executes a process of measuring the voltage-current characteristics of the wafer 1 (step S4).

After the measurement of the step S4, the controller 90, as shown in FIG. 4, executes a process of cutting off the planar heater 12 from energization and, meanwhile, executes a process of cooling the air-cooling block 21 by supplying compressed and cooled air to the air-cooling block 21 (step S5). Next, the controller 90 controls the temperature sensor 9 to measure the temperature of the heating block 11. When the temperature of the Peltier module 31 reaches a prescribed intermediate temperature (e.g., the maximum specification temperature of the Peltier module 31, which is, for example, 80 to 100 degrees Celsius) or more, the process returns to the step S5 and the controller 90 controls the Peltier module 31 to continuously cool the air-cooling block 21. On the other hand, when the temperature of the Peltier module 31 reaches less than a prescribed intermediate temperature (e.g., the maximum specification temperature of the Peltier module 31), the controller 90 executes a process of measuring the voltage-current characteristics of the wafer 1 at the temperature (step S7).

After the measurement of step S7, the controller 90 controls the Z axis actuator 60 to move upward so that, as shown in FIG. 5, the upper surface of the Peltier unit 40 comes in contact with the lower surface of the air-cooling part 30 (step S8). When the Peltier unit 40 contacts the air-cooling part 30, the controller 90 executes a process of lowering the temperature of the Peltier unit 40, thereby cooling the fixed unit 50 (step S9). When the temperature of the heating block 11 reaches a prescribed temperature (e.g., −60 degrees Celsius below the freezing point), the controller 90 executes a process of measuring the temperature characteristics of voltage and current of the wafer 1 (step S10).

As described above, the chuck unit 100 of the present embodiment is capable of heating the wafer 1 at a high temperature (e.g., 300 to 400 degrees Celsius) by using the planar heater 12 and cooling the wafer 1 at a low temperature of −60 degrees Celsius by using the Peltier module 31. Further, the Peltier module 31 of the maximum specification temperature (e.g., 80 to 100 degrees Celsius) has a property of deteriorating while being maintained at a high temperature. Meanwhile, the Peltier unit 40 is separated from the air-cooling part 30 while the chuck unit 100 is in a range from a high temperature of 400 degrees Celsius to an intermediate temperature (e.g., the maximum specification temperature of 80 to 100 degrees Celsius). Thereby, the Peltier module 31 is allowed to avoid the deterioration.

Modification

The present disclosure is not limited to the embodiment described above and following modifications are possible.

1. In the first embodiment, the air-cooling block 21 is used to cool the heating part 20.

However, a water-cooling can be used instead of the air-cooling. Fluid-cooling incudes air-cooling and water-cooling.

2. In the first embodiment, the Peltier unit 40 moves up and down and, meanwhile, the fixed unit 50 can move up and down instead.

What is claimed is:
1. A chuck unit comprising:
a chuck on which a semiconductor is mounted;
a heating part including a heater, disposed on the chuck and configured to heat the chuck;
a cooling block disposed on the heating part and configured to cool the heating part by using fluid-cooling;
a Peltier module configured to cool the cooling block and having a maximum specification temperature over which the Peltier module is deteriorated;
an actuator configured to move the Peltier module relative to the cooling block; and
a controller,
wherein the chuck, the heating part, and the cooling block are fixed together, wherein the controller controls the heating part to heat the chuck and the cooling block while the cooling block and the Peltier module are spaced apart from each other, wherein the controller controls the actuator to move the Peltier module to be in contact with the cooling block when the heated cooling block is cooled by using fluid-cooling below the maximum specification temperature of the Peltier module, and wherein the controller controls the Peltier module to cool the chuck through the cooling block while the Peltier module is in contact with the cooling block.

2. A method for controlling a temperature of a chuck unit, the chuck unit comprising:

a chuck on which a semiconductor is mounted;

a heating part including a heater disposed on the chuck and configured to heat the chuck;

a cooling block disposed on the heating part and configured to cool the heating part by using fluid-cooling; and a Peltier module configured to cool the cooling block and having a maximum specification temperature over which the Peltier module is deteriorated, wherein the chuck, the heating part, and the cooling block are fixed together, the method comprising:

heating the chuck and the cooling block by the heating part while the cooling block and the Peltier module are spaced apart from each other;

moving the Peltier module to be in contact with the cooling block when the heated cooling block is cooled by using fluid-cooling below the maximum specification temperature of the Peltier module; and cooling the chuck through the cooling block by the Peltier module while the Peltier module is in contact with the cooling block.

* * * * *

UNITED STATES PATENT AND TRADEMARK OFFICE
CERTIFICATE OF CORRECTION

PATENT NO. : 11,486,895 B2
APPLICATION NO. : 17/480911
DATED : November 1, 2022
INVENTOR(S) : Hirofumi Yanai It is certified that error appears in the above-identified patent and that said Letters Patent is hereby corrected as shown below:

In the Claims

At Column 6, Line 7, "flixed" should be -- fixed --.

Signed and Sealed this
Ninth Day of May, 2023

Katherine Kelly Vidal
*Director of the United States Patent and Trademark Office*